United States Patent
Hayami et al.

(10) Patent No.: US 6,653,952 B2
(45) Date of Patent: Nov. 25, 2003

(54) MODULATION METHOD, MODULATION APPARATUS, DEMODULATION METHOD, DEMODULATION APPARATUS, INFORMATION RECORDING MEDIUM, INFORMATION TRANSMISSION METHOD, AND INFORMATION TRANSMISSION APPARATUS

(75) Inventors: Atsushi Hayami, Kanagawa-ken (JP); Toshio Kuroiwa, Kanagawa-ken (JP); Tsuyoshi Oki, Kanagawa-ken (JP)

(73) Assignee: Victor Company of Japan, Limited, Yokohama (JP)

(*) Notice: Subject to any disclaimer, the term of this patent is extended or adjusted under 35 U.S.C. 154(b) by 0 days.

(21) Appl. No.: 10/160,023

(22) Filed: Jun. 4, 2002

(65) Prior Publication Data

US 2002/0186153 A1 Dec. 12, 2002

(30) Foreign Application Priority Data

Jun. 7, 2001 (JP) .................... P2001-173160

(51) Int. Cl.[7] ............................... H03M 7/00
(52) U.S. Cl. .............. 341/59; 341/65; 341/67
(58) Field of Search ................. 341/58, 59, 69, 341/50, 67, 68, 65

(56) References Cited

U.S. PATENT DOCUMENTS

| | | | | |
|---|---|---|---|---|
| 4,520,346 A | * | 5/1985 | Shimada | 341/58 |
| 4,547,890 A | * | 10/1985 | Gindi | 375/292 |
| 4,943,463 A | * | 7/1990 | Back | 428/44 |
| 5,734,341 A | * | 3/1998 | Walker | 341/95 |
| 5,805,087 A | * | 9/1998 | Walker | 341/95 |
| 6,300,886 B1 | | 10/2001 | Hayami | 341/59 |

FOREIGN PATENT DOCUMENTS

| | | | |
|---|---|---|---|
| EP | 0 751 518 | 1/1997 | G11B/20/14 |
| EP | 0 766 406 | 4/1997 | G11B/20/14 |
| EP | 0 880 234 | 11/1998 | G11B/20/14 |
| JP | 06-195887 | 7/1994 | G11B/20/14 |
| JP | 06195887 | 7/1994 | G11B/20/14 |
| JP | 10-340543 | 12/1998 | G11B/20/14 |
| JP | 10340543 | 12/1998 | G11B/20/14 |
| JP | 11346154 | 12/1999 | H03M/7/14 |
| JP | 11-346154 | 12/1999 | H03M/7/14 |
| JP | 2000-332613 | 11/2000 | H03M/7/14 |

OTHER PUBLICATIONS

Technology Development Division, Victor Company of Japan, "New RLL (1, 7;8,4,6) Modulation for Optical Recording", ODS 2001 Digest.

* cited by examiner

Primary Examiner—Peguy JeanPierre
(74) Attorney, Agent, or Firm—Nath & Associates PLLC; Marvin C. Berkowitz

(57) ABSTRACT

There is disclosed a modulation method in which a four bit unit of a plurality of continuous input data words is encoded into a six bit unit of a plurality of continuous output code words by referring to a plurality of coding tables including output code words corresponding to input data words, and coding table designation information in which a coding table for use in encoding the next input data word is designated. The plurality of coding tables includes at least a first coding table and a second coding table, and first and second signals respectively obtained by subjecting a first output code word of said first coding table corresponding to a predetermined input data word and a second output code word of said second coding table corresponding to said predetermined input data word to NRZI modulation are reverse to each other in polarity. Further, in particular, two redundant bits are inserted into the plurality of continuous output code words for each predetermined number of corresponding data words. Even with such redundant bits, a DSV control is performed in any section, k satisfies 9 in a (1, k) RLL rule, and a repetition frequency of a minimum run is limited.

15 Claims, 13 Drawing Sheets

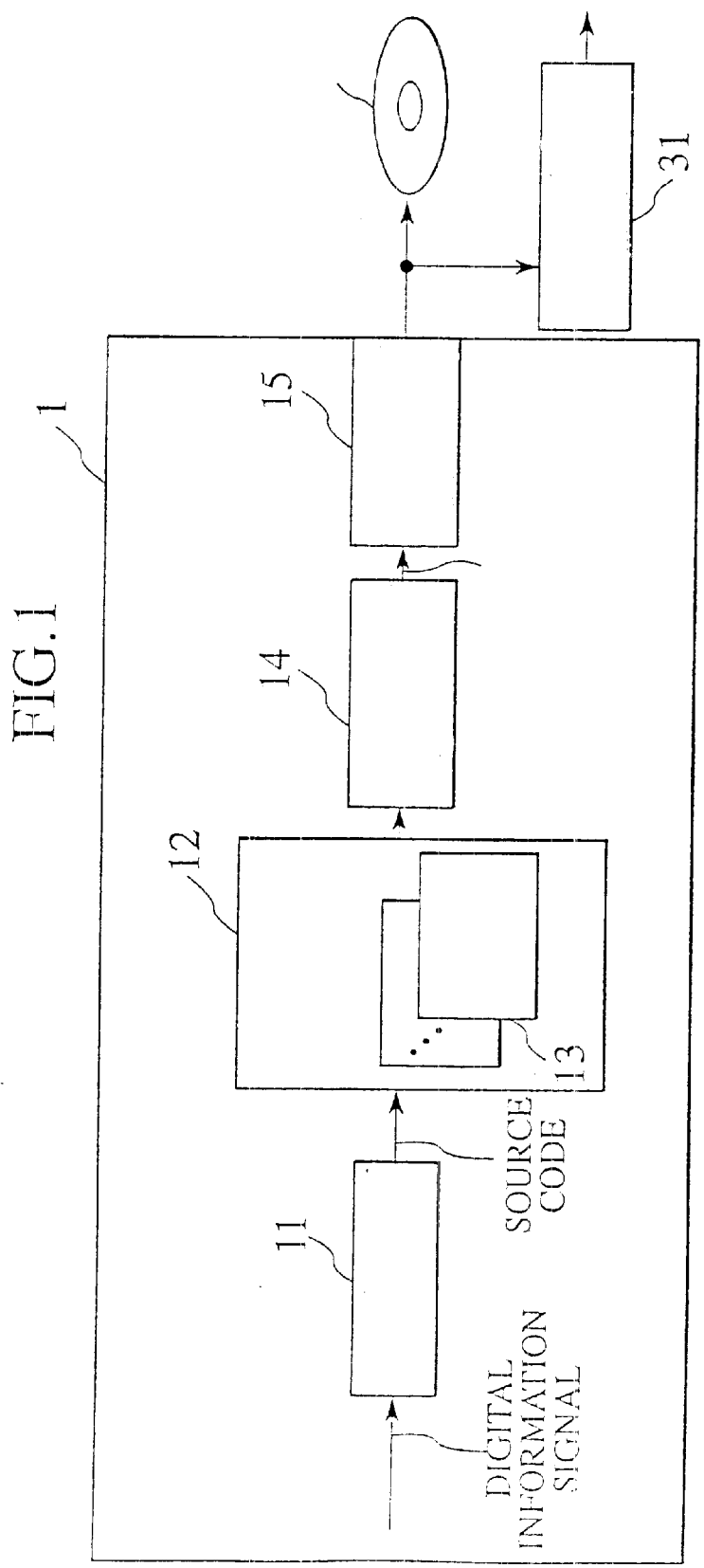

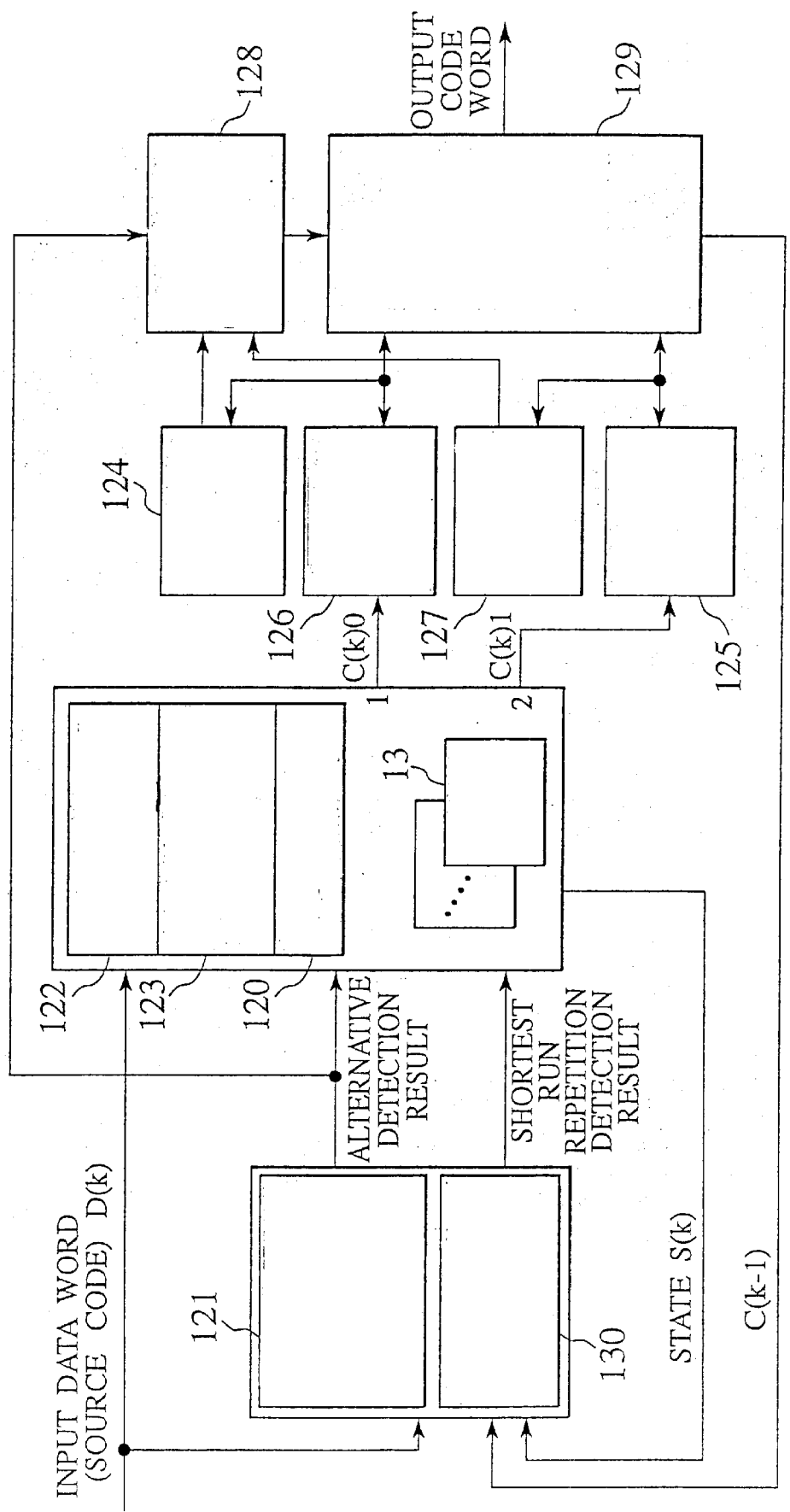

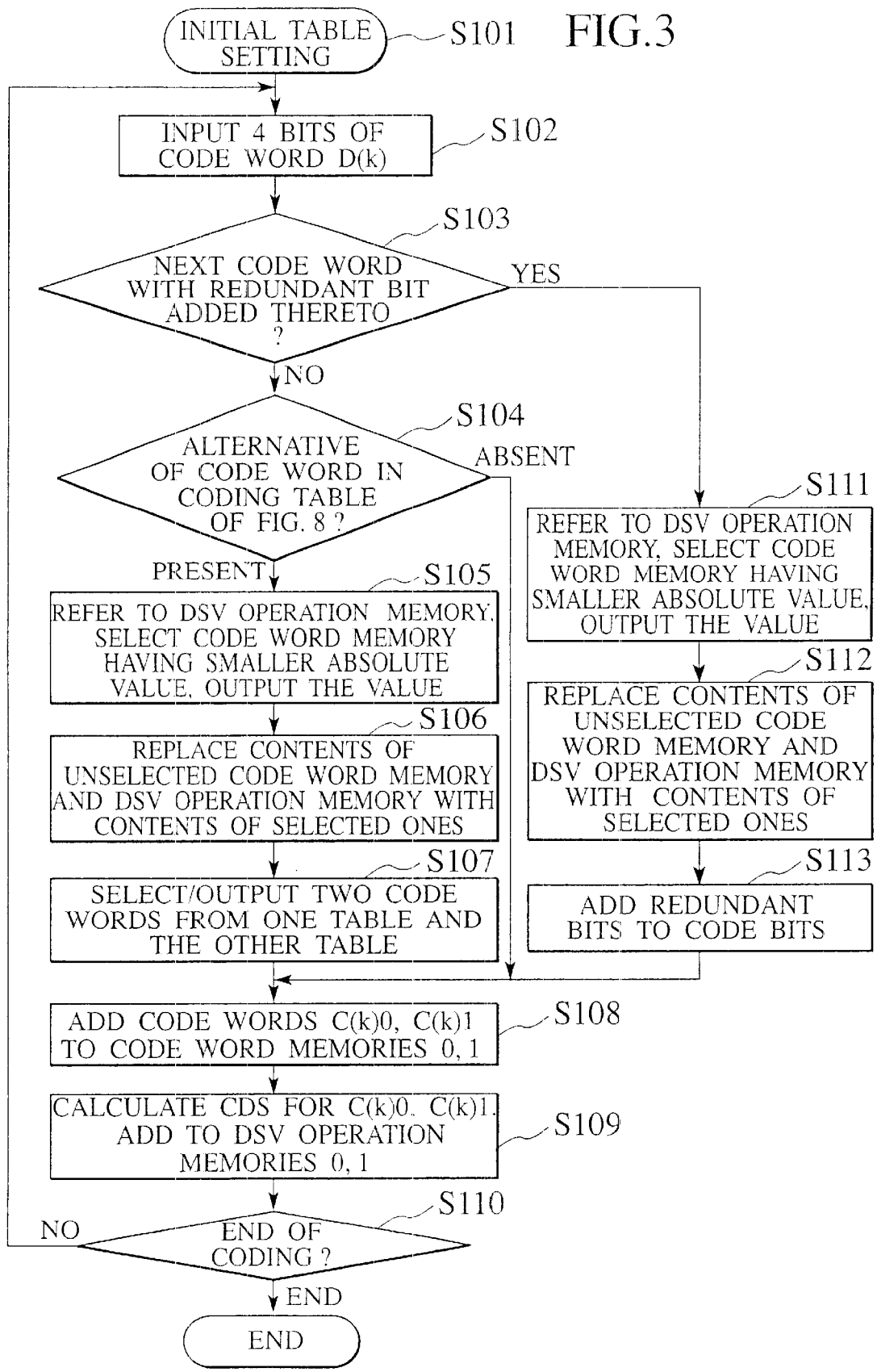

FIG. 4    S(k): state,  L(K-1): zero run length on LSB side of C(k-1), and D(k): input 4 bit data are shown.

| | |
|---|---|
| Condition 1 | During S(k) = 3,<br>((4 ≦ L(k-1) ≦ 5) and D(k) ≦ 6) or (L(k-1) = 6 and (D(k) = 0 or 1 or 3 or 5) replaceable with S(k) = 1. |
| Condition 2 | During S(k) = 2,<br>((5 ≦ L(k-1) ≦ 6) and 7 ≦ D(k) or (L(k-1) = 4 and 10 ≦ D(k) replaceable with S(k) = 1. |
| Condition 3 | During S(k) = 2,<br>(1 ≦ L(k-1) ≦ 4) and D(k) = 0 or 5) replaceable with S(k) = 0. |
| Condition 4 | During S(k) = 2<br>(not immediately before redundant bits) and (L(k-1) = 1) and (D(k) = 13 or 15) or<br>(immediately before redundant bits) and (L(k-1) = 1) and (D(k) = 15) and ((7 ≦ D(k+1)) or (D(k+1) = 0 or 5)) or<br>(immediately before redundant bits) and (L(k-1) = 1) and (D(k) = 13) and ((D(k+1) ≦ 6) or (D(k+1) = 13 or 15)) replaceable with S(k) = 0.<br><br>101010 repetition prohibition processing is performed. |
| Condition 5 | During S(k) = 2<br>(not immediately before redundant bits) and (L(k-1) = 2) and (D(k) = 13 or 15) replaceable with S(k) = 0. |
| Condition 6 | During S(k) = 2 and L(k-1) = 3<br>(not immediately before redundant bits) and (D(k) = 13 and (D(k+1) ≦ 6) or (D(k+1) = 13 or 15)) replaceable with S(k) = 0. |
| Condition 7 | During S(k) = 2 and L(k-1) = 3<br>(not immediately before redundant bits) and (D(k) = 15 and ((7 ≦ D(k+1)) or (D(k+1) = 0 or 5)) replaceable with S(k) = 0.<br><br>2T pattern repetition prohibition processing is performed.<br><br>Code word conversion of L(k-1) = 6 is not performed immediately after redundant bits. |

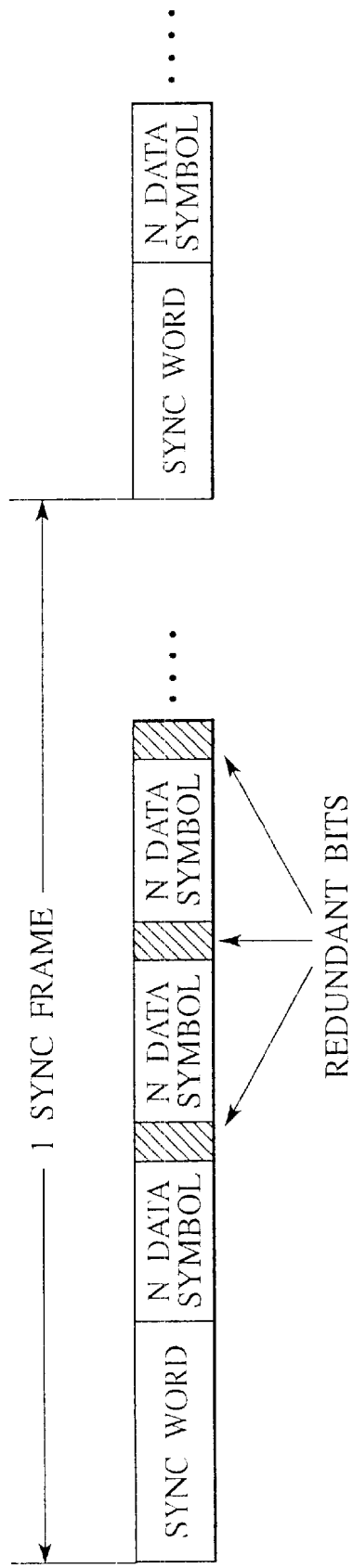

FIG.6

| PRECEDENT CODE WORD TYPE | REDUNDANT BIT PATTERN |
|---|---|
| LSB OF PRECEDENT CODE WORD IS 1 | 01 OR 00 |
| LSB OF PRECEDENT CODE WORD IS 0 | 10 OR 00 |

FIG.7

| DECIMAL | BINARY |
|---|---|
| 0 | 000000 |
| 1 | 000001 |
| 2 | 000010 |
| 4 | 000100 |
| 5 | 000101 |
| 8 | 001000 |
| 9 | 001001 |
| 10 | 001010 |
| 16 | 010000 |
| 17 | 010001 |
| 18 | 010010 |
| 20 | 010100 |
| 21 | 010101 |
| 32 | 100000 |
| 33 | 100001 |
| 34 | 100010 |
| 36 | 100100 |
| 37 | 100101 |
| 40 | 101000 |
| 41 | 101001 |
| 42 | 101010 |

FIG. 8

| S(k) | | 0 | | | 1 | | | 2 | | | 3 | |
|---|---|---|---|---|---|---|---|---|---|---|---|---|
| D(k) | | C(k) | | S(k+1) | | C(k) | | S(k+1) | | C(k) | | S(k+1) |
| 0  | 1  | 000001 | 0 | 9  | 001001 | 0 | 33 | 100001 | 0 | 41 | 101001 | 0 |
| 1  | 17 | 010001 | 1 | 5  | 000101 | 1 | 17 | 010001 | 1 | 37 | 100101 | 1 |
| 2  | 18 | 010010 | 2 | 2  | 000010 | 2 | 18 | 010010 | 2 | 34 | 100010 | 2 |
| 3  | 17 | 010001 | 0 | 5  | 000101 | 0 | 17 | 010001 | 0 | 37 | 100101 | 0 |
| 4  | 18 | 010010 | 1 | 2  | 000010 | 1 | 18 | 010010 | 1 | 34 | 100010 | 1 |
| 5  | 1  | 000001 | 1 | 9  | 001001 | 1 | 33 | 100001 | 1 | 41 | 101001 | 1 |
| 6  | 18 | 010010 | 3 | 2  | 000010 | 3 | 18 | 010010 | 3 | 34 | 100010 | 3 |
| 7  | 20 | 010100 | 1 | 4  | 000100 | 1 | 36 | 100100 | 1 | 20 | 010100 | 1 |
| 8  | 21 | 010101 | 0 | 4  | 000100 | 2 | 36 | 100100 | 2 | 21 | 010101 | 0 |
| 9  | 21 | 010101 | 1 | 4  | 000100 | 3 | 36 | 100100 | 3 | 21 | 010101 | 1 |
| 10 | 20 | 010100 | 2 | 10 | 001010 | 1 | 42 | 101010 | 1 | 20 | 010100 | 2 |
| 11 | 20 | 010100 | 3 | 8  | 001000 | 1 | 40 | 101000 | 1 | 20 | 010100 | 3 |
| 12 | 16 | 010000 | 2 | 8  | 001000 | 2 | 40 | 101000 | 2 | 16 | 010000 | 2 |
| 13 | 0  | 000000 | 3 | 10 | 001010 | 3 | 42 | 101010 | 3 | 32 | 100000 | 3 |
| 14 | 16 | 010000 | 3 | 8  | 001000 | 3 | 40 | 101000 | 3 | 16 | 010000 | 3 |
| 15 | 0  | 000000 | 2 | 10 | 001010 | 2 | 42 | 101010 | 2 | 32 | 100000 | 2 |

FIG.9

| INPUT DATA WORD | TABLE SELECTION INFORMATION | OUTPUT CODE WORD | TABLE SELECTION INFORMATION |
|---|---|---|---|
| D(k) | S(n) | C(k) | S(n+1) |
| 4 | 0 | 18 | 1 |
| 5 | 1 | 9 | 1 |
| 6 | 1 | 2 | 3 |
| 7 | 3 | 20 | 1 |
| 8 | 1 | 4 | 2 |

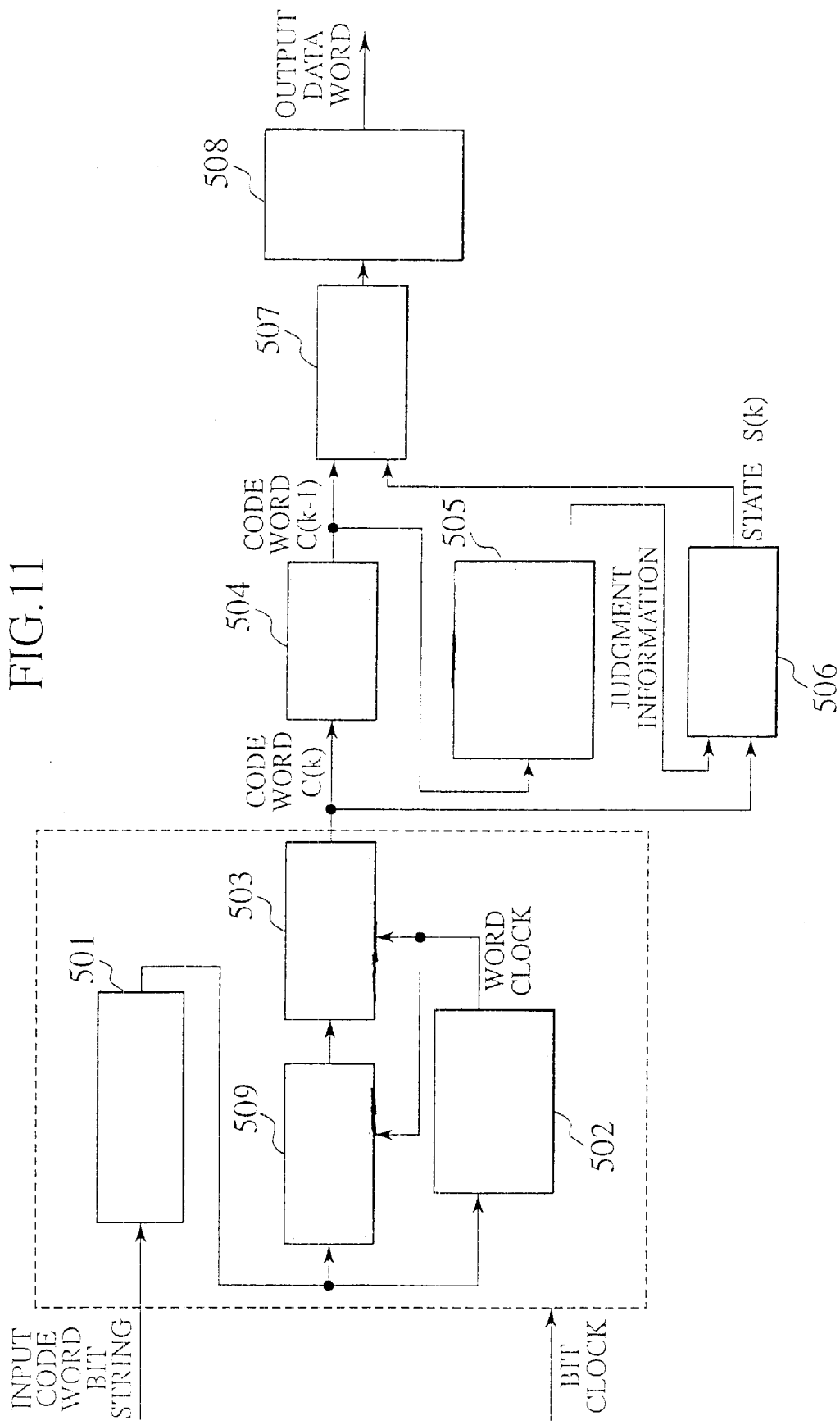

FIG.12

| JUDGMENT INFORMATION | ZERO RUN LENGTH ON LSB SIDE | NEXT STATE |
|---|---|---|
| 0 | 0 | 0 |
| 1 | 1, 2, 3 | 1, 2, 3 |
| 2 | 5, 6 | 2, 3 |
| 3 | 4 | 2, 3 |

FIG.14

| Dk | Ck | JUDGMENT INFORMATION | Sk |
|---|---|---|---|
| 14 | 0 1 0 0 0 0 | 3 | 3 |
| 0 | 0 0 1 0 0 1 | 0 | 0 |
| 1 | 0 0 0 0 0 1 | 0 | 1 |
| 3 | 0 0 0 1 0 1 | 0 | 0 |
| 3 | 0 1 0 0 0 1 | 0 | — |

FIG.13

```
{
int c.
if (judgment information == 0){
  if (state == 0){
    if       (d==1)  c=  0;
    else if (d==17)  c=  3 ;
    else if (d==21)  c=  8 ;
    else if (d==9 )  c=  0 ;
    else if (d==5 )  c=  3 ;
    else if (d==33)  c=  0 ;
    else if (d==41)  c=  0 ;
    else if (d==37)  c=  3 ;
  }
  if (state == 1){
    if       (d==17)  c=  1 ;
    else if (d==1 )  c=  5 ;
    else if (d==21)  c=  9 ;
    else if (d==5 )  c=  1 ;
    else if (d==9 )  c=  5 ;
    else if (d==33)  c=  5 ;
    else if (d==37)  c=  1 ;
    else if (d==41)  c=  5 ;
  }
}
else if (judgment information == 1){
  if (state == 1){
    if (d==20 )  c=  7 ;
    else if (d==18)  c=  4 ;
    else if (d==2 )  c=  4 ;
    else if (d==10)  c= 10 ;
    else if (d==4 )  c=  7 ;
    else if (d==8 )  c= 11 ;
    else if (d==36)  c=  7 ;
    else if (d==42)  c= 10 ;
    else if (d==40)  c= 11 ;
    else if (d==34)  c=  d ;
  }
  if (state == 2){
    if (d==18 )  c=  2 ;
    else if (d==20)  c= 10 ;
    else if (d==2 )  c=  2 ;
    else if (d==4 )  c=  8 ;
    else if (d==8 )  c= 12 ;
    else if (d==10)  c= 15 ;
    else if (d==36)  c=  8 ;
    else if (d==40)  c= 12 ;
    else if (d==42)  c= 15 ;
    else if (d==34)  c=  2 ;
  }
  if (state == 3){
    if (d==18 )  c=  6 ;
    else if (d==20)  c= 11 ;
    else if (d==2 )  c=  6 ;
    else if (d==4 )  c=  9 ;
    else if (d==10)  c= 13 ;
    else if (d==8 )  c= 14 ;
    else if (d==36)  c=  9 ;
    else if (d==42)  c= 13 ;
    else if (d==40)  c= 14 ;
    else if (d==34)  c=  6 ;
  }
}
else if (judgment information == 3 && d == 16&&
state == 1){
  c = 8;
}
else{
  if (state == 2){
    if (d== 16 )  c= 12 ;
    else if (d==0 )  c= 15 ;
    else if (d==32)  c= 15 ;
  }
  if (state == 3){
    if (d==0 )  c= 13 ;
    else if (d==16)  c= 14 ;
    else if (d==32)  c= 13 ;
  }
}
return c;
}
```

MODULATION METHOD, MODULATION APPARATUS, DEMODULATION METHOD, DEMODULATION APPARATUS, INFORMATION RECORDING MEDIUM, INFORMATION TRANSMISSION METHOD, AND INFORMATION TRANSMISSION APPARATUS

BACKGROUND OF THE INVENTION

1. Field of the Invention

The present invention relates to a modulation method, a modulation apparatus, a demodulation method, a demodulation apparatus, an information recording medium, an information transmission method, and an information transmission apparatus. More particularly, it relates to a modulation method, a modulation apparatus, a demodulation method, a demodulation apparatus, an information recording medium, an information transmission method, and an information transmission apparatus suitable for modulating, demodulating, recording, and transmitting a digital information signal as an information code series which satisfies k=9 in a (1, k) run length limited (hereinafter referred to as "(1, k) RLL"), while limiting the repetition of a shortest run, so that the digital information signal is recorded in storage mediums such as an optical disk and magnetic disk by a recording code series to satisfy k=9 in the (1, k) RLL.

2. Description of the Related Art

As a recording modulation system for recording a series of digital information signals in recording mediums such as an optical disk and magnetic disk, (1, 7) RLL has heretofore been used frequently. However, in the (1, 7) RLL which has heretofore been used, it is difficult to suppress signal components in the vicinity of a direct current (DC). Depending on a bit pattern, a large DC component is generated, and for example, a spectrum of an information signal component is entrained in a servo signal band. In consequence, it is predicted that problems adversely influencing servo capabilities occur.

Moreover, it is known that the repetition of a shortest run, that is, 2T (T denotes a channel bit interval) in the (1, 7) RLL is disadvantageous for clock detection by a phase locked loop (PLL). In this connection, it is described in Jpn. Pat. Appln. KOKAI Publication No. 1994-195887 titled "Recording Code Modulation Apparatus" that a specified bit pattern is prevented from being repeated and thereby DC components are suppressed. Moreover, it is also disclosed in Jpn. Pat. Appln. KOKAI Publication No. 1998-340543 titled "Encode Apparatus, Decode Apparatus, Encode Method, and Decode Method" or in Jpn. Pat. Appln. No. 1998-150280 corresponding to KOKAI Publication No. 11-346154 titled "Modulation Apparatus and Method, Demodulation Apparatus and Method, and Providing Medium" that redundant bits are inserted not to disturb the (1, 7) RLL rule, and thereby the DC components are suppressed. Furthermore, in Jpn. Pat. Appln. KOKAI Publication No. 1999-346154, (1, 7) RLL modulation is disclosed in which the repetition of the shortest run can be limited.

However, according to the Jpn. Pat. Appln. KOKAI Publication No. 1994-195887, the repetition of the specified pattern is reduced by means such as bit reverse and randomizing, but it is difficult to sufficiently suppress the DC components. Moreover, according to the Jpn. Pat. Appln. KOKAI Publication No. 1998-340543, as compared with the former, the DC components are largely suppressed, but all of the redundant bits cannot be DSV controlled. Furthermore, unless the redundant bits are used, it is disadvantageously impossible to perform the DSV control. On the other hand, in the Jpn. Pat. Appln. KOKAI Publication No. 1998-150280, parity numbers (parity of 1 included in a symbol) of data bits and code bits are set to be the same, and the DSV control is necessarily possible by inserting the redundant bits in the data bits. However, according to the Jpn. Pat. Appln. KOKAI Publication No. 1998-150280 or 1999-346154, the DSV control is possible by the redundant bits, but there is a problem that the DSV control cannot be performed in another section.

SUMMARY OF THE INVENTION

The present invention has been developed under the above-described circumstances. An object of the present invention is to provide a method and apparatus in which even with insertion of redundant bits, DSV control is possible in any section, k satisfies 9 in a (1, k) RLL rule, and a repetition frequency of a minimum run is limited.

To achieve the object, there is provided a modulation method comprising: referring to a plurality of coding tables including output code words corresponding to input data words, and coding table designation information in which an coding table for use in encoding a next input data word is designated, to thereby encode a four bits unit of a plurality of continuous input data words into a six bits unit of a plurality of continuous output code words; and inserting two redundant bits into each predetermined number of data words of the plurality of continuous output code words, so that a digital sum variation (DSV) control is possible, k satisfies 9 in a (1, k) run length limited (RLL) rule, and a successive repetition frequency of a minimum run is limited.

Moreover, to achieve the object, there is provided a modulation apparatus comprising: a plurality of coding tables including output code words corresponding to input data words, and coding table designation information in which an coding table for use in encoding a next input data word is designated; encoding means for referring to the plurality of coding tables, and thereby encoding a four bits unit of a plurality of continuous input data words into a six bits unit of a plurality of continuous output code words; and redundant bits inserting means for inserting two redundant bits into each predetermined number of data words of the plurality of continuous output code words, so that a digital sum variation (DSV) control is possible, k satisfies 9 in a (1, k) run length limited (RLL) rule, and a successive repetition frequency of a minimum run is limited.

Furthermore, to achieve the object, there is provided a demodulation method of demodulating the plurality of continuous output code words encoded by using the modulation method according to the first aspect of the present invention and having the two redundant bits inserted into each predetermined number of data words, into a reproduction data string, the method comprising: extracting the inserted redundant bits and restoring the plurality of continuous code words; and demodulating the plurality of continuous code words into the reproduction data string based on judgment information indicating an coding table by which a subsequent code word is encoded among the plurality of coding tables, and the subsequent code word.

Additionally, to achieve the object, there is provided a demodulation apparatus which demodulates the plurality of continuous output code words encoded by using the modulation apparatus according to the second aspect of the present invention and having the two redundant bits inserted into each predetermined number of data words, into a reproduction data string, the apparatus comprising: redundant bit extracting means for extracting the redundant bits and restoring the plurality of continuous code words; and demodulating means for demodulating the plurality of continuous code words into the reproduction data string based on judgment information indicating an coding table by which a subsequent code word is encoded among the plurality of coding tables, and the subsequent code word.

Moreover, to achieve the object, there is provided an information recording medium in at least a part of which a code word encoded by using the modulation method according to the first aspect of the present invention is recorded.

Furthermore, to achieve the object, there is provided an information recording medium in at least a part of which a code word encoded by using the modulation apparatus according to the second aspect of the present invention is recorded.

Additionally, to achieve the object, there is provided an information transmission method comprising a step of transmitting a code word encoded by using the modulation method according to the first aspect of the present invention as transmission information.

Moreover, to achieve the object, there is provided an information transmission apparatus which transmits a code word encoded by using the modulation apparatus according to the second aspect of the present invention as transmission information.

The nature, principle and utility of the invention will become more apparent from the following detailed description when read in conjunction with the accompanying drawings.

BRIEF DESCRIPTION OF THE DRAWINGS

In the accompanying drawings:

FIG. 1 is a basic constitution diagram of a modulation apparatus of the present invention;

FIG. 2 is a block diagram of a 4-6 modulator of the present invention;

FIG. 3 is a flowchart showing an encode operation of the modulation apparatus shown in FIG. 2;

FIG. 4 is an explanatory view of the encode operation of the modulation apparatus shown in FIG. 2;

FIG. 5 is an explanatory view of insertion of redundant bits according to the modulation apparatus of the present invention;

FIG. 6 is a diagram showing a relation between a type of a precedent code word and a redundant bit pattern for use in the modulation apparatus of the present invention;

FIG. 7 is a diagram showing binary output code words each represented in six bits corresponding to decimal input data words each corresponding four bits;

FIG. 8 is a diagram showing contents of four coding tables S(k)=0 to S(k)=3 for use in the modulation apparatus of the present invention;

FIG. 9 is an explanatory view of an encode process in the modulation apparatus of the present invention;

FIG. 11 is a block diagram of one embodiment of a demodulation apparatus of the present invention;

FIG. 12 is a diagram showing judgment information for use in the demodulation apparatus of the present invention;

FIG. 13 is a diagram showing a demodulation table for use in the demodulation apparatus of the present invention; and FIG. 14 is an explanatory view of the operation of the demodulation apparatus of the present invention.

DESCRIPTION OF THE PREFERRED EMBODIMENTS

Figure 10A:
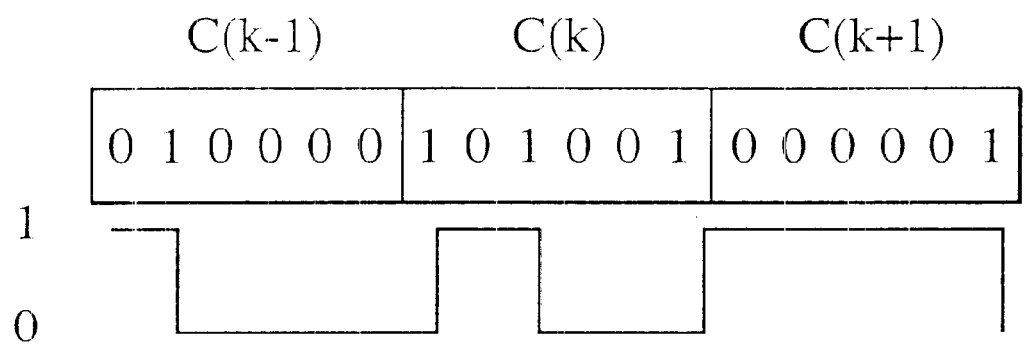
FIGS. 10A and 10B are explanatory view of an operation of the modulation apparatus of the present invention.

Embodiments of the present invention will be described hereinafter in detail with reference to the drawings.

Types of six bits unit of output code word satisfying a (1, 7) RLL are shown in FIG. 7. As one example of an coding table based on the code word type, four coding tables shown in FIG. 8 (coding table number S(k)="0" to "3") can be constituted. S(k)="0" to S(k)="3" denote coding table selection numbers allocated to four coding tables. Moreover, S(k+1) in FIG. 8 denotes the coding table selection number for selecting the coding table for use in performing the next encoding. Additionally, for allocation of a data word D(k) and code word C(k), it is possible to change arrangement so that an encode rule is not disturbed and demodulation is not obstructed. The embodiments of the present invention are effective in constitutions other than the constitution of the coding table of FIG. 8.

Moreover, it is apparent that the constitution of the coding table for converting the data word formed of bits of an integral multiple of 4 to a code bit of an integral multiple of 6 while satisfying a DSV control rule according to the present invention and, for example, to allocate eight bits of data word to 12 bits of code word bits can easily be analogized from the present invention, and is included in the present invention.

First, a modulation apparatus 1 of the present invention will be described with reference to FIG. 1. A digital information signal obtained by converting an image, sound, and the like to be modulated into a binary series by discrete means (not shown) is subjected to so-called formatting such as addition of an error correction code and sector structuring in a format unit 11, thereafter forms a source code series every four bits, and is added to a 4-6 modulator 12.

The 4-6 modulator 12 uses an coding table 13 shown as one example in FIG. 8 to perform an encode processing described later and add a predetermined synchronous word. Thereafter, an NRZI conversion circuit 14 NRZI-converts encode information from the 4-6 modulator 12, and sends the information as a recording signal to a recording driving circuit 15. The encode information sent via the recording driving circuit 15 is recorded in a recording medium 2 or transmitted/encoded by transmission encoding means 31 and sent to a transmission medium 3.

FIG. 2 is a block diagram showing a constitution example for describing an operation of the 4-6 modulator 12 of FIG. 1 in more detail. Input data words (source codes) D(k) are added to a code word alternative presence/absence detection circuit 121, shortest run repetition detection unit 130, coding table address operation unit 122, synchronous word generation unit 123, and redundant bit insertion unit 120. The code word alternative presence/absence detection circuit 121 uses D(k) and state S(k) to detect whether there is a prospective code word having a different DSV polarity. An coding table address operation is performed based on the detection result and D(k), and prospective code words C(k)0, C(k)1 from a plurality of coding tables 13 are sent to a code word memory [0] 126, and code word memory [1] 125, respectively.

The code word memory [0] 126 and code word memory [1] 125 are connected to a DSV operation memory [0] 124 and DSV operation memory [1] 127, respectively. Every time the code words C(k)0, C(k)1 are inputted into the code word memory [0] 126 and code word memory [1] 125, CDSs are calculated, and stored DSV values are updated, and calculation results of absolute values of the DSV values are ready to output. Here, when the code word alternative presence/absence detection circuit 121 detects a source code D(k) having an alternative, an absolute value comparison unit 128 compares absolute values of DSVs stored in the DSV operation memory [0] 124 and DSV operation memory [1] 127. A memory control unit/code output unit 129 selects the code word stored in the code word memory having a smaller absolute value of DSV, outputs the code word as an output code word to the outside, and replaces contents of the code word memory and DSV operation memory on unselected side with contents of the selected side code word memory and DSV operation memory on selected side.

FIG. 3 is a flowchart showing the above-described content in detail. Additionally, it has been described that two code word memories are disposed. Moreover, when the code word alternative presence/absence detection circuit 121 detects the D(k) having alternatives, the output code word is quickly outputted. However, the number of the code word memories is not limited to two. When the D(k) having alternatives is detected, it is unnecessary to quickly output the output code word. Even in a method of disposing more memories, referring to some selectable source codes, and selecting/outputting a code word string having a smallest DSV, the present invention is effective.

The encoding of a four bits unit of input data words D(k) under (1, 7) RLL will next concretely be described with reference to FIG. 9. As input data words D(k), D(k+1) ... , "4, 5, 6, 7, 8 (decimal)" is used as an example. In an initial state of the encoding, by operations such as insertion of a synchronous word whose description is omitted, an initial selection number of coding table is determined, for example, an coding table S(k)="0" is selected. When the input data word D(k)=4 is inputted in the coding table S(k)="0", an output code word C(k)=18 (decimal) is outputted, and the next coding table selection number S(k+1)="1" is selected. Subsequently, when the input data word D(k)=5 is inputted in the selected coding table S(k)="1", the output code word C(k)=9 (decimal) is outputted, and the next coding table selection number S(k+1)="1" is selected. Similarly, when the input data word D(k)=6 is inputted in the coding table S(k)="1", the output code word C(k)=2 is outputted, and the coding table selection number S(k+1)="3" is selected. Subsequently, when the input data word D(k)=7 is inputted in the coding table S(k)="3", the output code word C(k)=20 is outputted, and the coding table selection number S(k+1)="1" is selected. Moreover, when the input data word D(k)=8 is inputted in the coding table S(k)="1", the output code word C(k)=4 is outputted, and the coding table selection number S(k+1)="2" is selected.

As a result, "4, 5, 6, 7, 8 (decimal)" as the input data word D(k) is encoded into "010010, 001001, 000010, 010100, 000100 (binary)" as the output code word C(k) and successively outputted. Therefore, a series of output code word string obtained by successively and directly coupling the above-described five output code words C(k) is 010010001001000010010100000100, and the output code word string which satisfies the (1, 7) RLL can be obtained.

In this example, no source code having alternatives appears. However, according to the modulation apparatus described with reference to FIGS. 1 to 3, when the coding table shown in FIG. 8 is used, the code word string satisfying the (1, 7) RLL and successively and directly coupled can be obtained by four bits of source code D(k), and S(k) obtained by delaying S(k+1) outputted in outputting the previous code word by one word (having a four bit length as a source code).

An operation of the code word alternative presence/absence detection circuit 121 will next be described in detail with reference to FIG. 4. FIG. 4 is a diagram in which conditions concerning the operation of the code word alternative presence/absence detection circuit 121 with (1, 9) RLL are arranged. In FIG. 4, a respect related with a shortest run limitation and redundant bit will be described later in detail. Here, k=9 is shown, because two redundant bits are inserted in the coding table of k=7 and thereby k increases by 2. Therefore, DSV control is also performed so as to satisfy k=9.

In FIG. 4, S(k) indicates a state of a k-th symbol, L(k−1) indicates a zero run length on LSB side of the code word C(k−1) having a k−1 symbol, that is, the continuation number of bits 0, and D(k) denotes four bit data corresponding to the k-th symbol.

For condition 1, with the state S(k) of 3, when the continuation number L(k−1) of bits 0 on LSB side of the previous code word is 4 or 5, that is, 010000 or 100000, and further when the input data D(k) is 6 or less, the code word can be replaced with the corresponding code word in the coding table of S(k)=1. Similarly, when L(k−1) is 6, and when D(k) is 0, 1, 3, or 5, the code word can be replaced with the code word of S(k)=1.

For condition 2, with S(k)=2, when L(k−1) is 5 or 6 and D(k) is 7 or more, or when L(k−1) is 4 and D(k) is 10 or more, the code word can be replaced with the code word of S(k)=1.

For condition 3, with S(k)=2, when L(k−1) is not less than 1 and not more than 4, and D(k)=0 or 5, the code word can be replaced with the code word of S(k)=0.

For condition 4, in states other than a state immediately before the redundant bits, when L(k−1)=1 and D(k) is 13 or 15, the code word can be replaced with the code word of S(k)=0. Moreover, immediately before the redundant bits, when L(k−1)=1, D(k)=15, and D(k+1) is 7 or more, or 0 or 5, the code word can be replaced with the code word of S(k)=0. Furthermore, immediately before the redundant bits, when L(k−1)=1, D(k)=13, and D(k+1) is 6 or less, or 13 or 15, the code word can be replaced with the code word of S(k)=0.

For condition 5, with S(k)=2, in the state other than the state immediately before the redundant bits, and when L(k−1)=2, and D(k)=13 or 15, the code word can be replaced with the code word of S(k)=0.

For condition 6, with S(k)=2 and L(k−1)=3, in the state other than the state immediately before the redundant bits, when D(k)=13, and D(k+1) is 6 or less, or 13 or 15, the code word can be replaced with the code word of S(k)=0.

For condition 7, with S(k)=2 and L(k−1)=3, in the state other than the state immediately before the redundant bits, when D(k)=15, and D(k+1) is 7 or more, or 0 or 5, the code word can be replaced with the code word of S(k)=0.

Figure 10B:
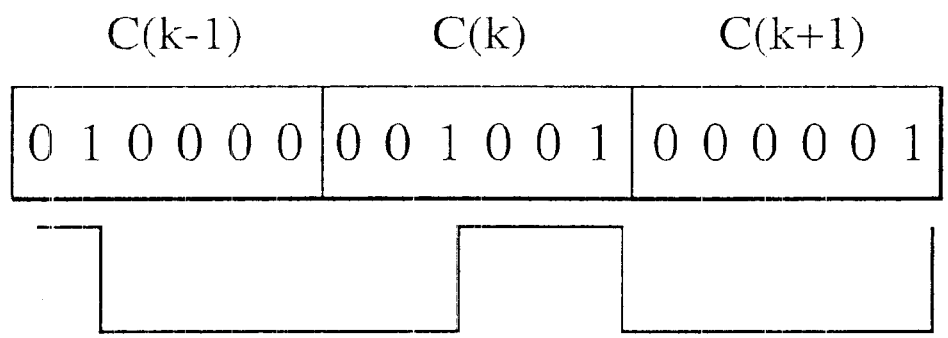

All the pairs of code words replaceable with each other on the conditions 1 to 7 are arranged such that the number of 1 included in code bits of one code word of each pair is even while the number of 1 included in code bits of the other code word is odd and that code words of each pair have the same next state S(k+1) as shown in FIG. 8. Moreover, even with the replacement, the (1, 9) RLL is not broken. Furthermore, the difference in the number of 1 between the code words enables the DSV control apparently because the difference in the number of 1 between C(k)s causes the reverse of the output level after NRZI modulation as shown in FIGS. 10A and 10B. For this reason, according to the present modulation method and apparatus, as described above, while the (1, 9) RLL is satisfied, the DSV control is possible.

Additionally, as described above, according to the coding table of the present invention, a plurality of coding tables 13 are used which include the output code word C(k) corresponding to the input data word D(k) and coding table designation information S(k+1) for designating the coding table for use in encoding the next code word. This can realize the modulation method or the modulation apparatus in which the code having the (1, 9) RLL can be generated.

The insertion of the redundant bits according to the present invention will next be described with reference to FIGS. 5, 6, 8. FIG. 5 is a diagram showing the constitution of the synchronous frame in which the redundant bits are inserted for each N data symbol after the synchronous word. As shown in FIG. 6, the redundant bits can take 01 or 00 when the LSB of the precedent code word is 0, and can take 10 or 00 when the LSB of the precedent code word is 0.

For the redundant bits 01, bits 00 enable the DSV polarity to be reversed. Similarly, for the redundant bits 10, bits 00 enable the DSV polarity to be reversed.

Here, as described with reference to FIG. 4, according to the coding tables of FIG. 8, it is possible to generate the code word by the limitation of k=7 and even with the redundant bits of 00, the limitation of k=9 can be maintained. That is, according to the present invention, when two redundant bits are inserted in each predetermined interval, that is, the N data symbol interval, the code word series having an opposite DSV polarity can be surely generated.

For example, in FIG. 8, when S(k)=0 and D(k)=13, C(k) is 000000, and the number of 0 on the MSB side of the next code word is one at maximum. Here, even when the redundant bits of 00 is inserted, the number of 0 is limited to 9, and thus k=9 can be maintained. Additionally, the redundant bits can be inserted even before or after the code bit to be encoded at present.

The method of the DSV control applicable even when the redundant bits according to the present invention are inserted will next be described with reference to FIG. 3 based on the above-described selection of the code word.

First, in FIG. 3, an initial table can be set by determining the S(k) subsequent to the synchronous word to be added to the code word (step 101). Subsequently, four bits of source code D(k) are inputted (step 102), and encoded by S(k) and D(k) according to the coding tables of FIG. 8. In this process, the previously encoded C(k−1) is referred to, the zero run length on the LSB side is calculated, and the bit pattern of LSB is detected. Thereafter, it is next judged whether the next code word is one to be added with the redundant bits (step 103). If No, it is judged according to the condition of FIG. 5 whether there is an alternative of the code word (step 104).

When the selectable code word is not present in the coding table ("absent" in step 104), the code words C(k)0, C(k)1 outputted from the coding tables are added to the code word memory [0] 126 and code word memory [1] 125, respectively (step 108), the respective CDSs are calculated, and the DSV operation memory [0] 124 and DSV operation memory [1] 127 are updated (step 109).

When the selectable code word exists in the coding table ("present" in step 104), the code word alternative presence/absence detection circuit 121 outputs the signal indicating the presence of the alternative, the absolute values outputted from the DSV operation memory [0] and DSV operation memory [1] are compared in an absolute value comparison unit 128, and the code series (code word) having a smaller absolute value is selected and outputted from the memory control unit/code output unit 129 (step 105). Thereafter, the contents of the unselected code word memory and DSV operation memory are rewritten with the contents of the selected code word memory and DSV operation memory (step 106). Subsequently, as described with reference to FIG. 4, the code words selectable as the prospective code words are selected from one coding table and the other coding table determined by S(k), and outputted as C(k)0, C(k)1 (step 107).

Subsequently, the respective code words C(k)0, C(k)1 outputted from the coding table are added to the code word memory [0] 126 and code word memory [1] 125, respectively (step 108), the respective CDSs are calculated, and the DSV operation memory [0] 124 and DSV operation memory [1] 127 are added with the respective calculated CDSs (step 109).

On the other hand, when the next code word is one to be added with the redundant bits (Yes in step 103), the absolute values outputted from the DSV operation memory [0] and DSV operation memory [1] are compared in the absolute value comparison unit 128, and the code series (code word) having a smaller absolute value is selected and outputted from the memory control/code output unit 129 (step 111). Thereafter, the contents of the unselected code word memory and DSV operation memory are rewritten with the contents of the selected code word memory and DSV operation memory (step 112). Subsequently, as described with reference to FIG. 6, the redundant bit pattern is selected according to the LSB of the code word, the code word obtained by adding one of the redundant bits to the code word is set to C(k)0, and the code word with the other redundant bits added thereto is set to C(k)1, and the C(k)0 and C(k)1 are added to the code word memory [0] 126 and the code word memory [1] 125 (steps 113, 108). The CDSs of the prospective code words C(k)0, C(k)1 are calculated, and the DSV operation memory [0] 124 and DSV operation memory [1] 127 are added with the respective calculated CDSs (step 109). When the above-described operation is performed until the end of the coding (step 110), the generation of the code word with the suppressed DC components including the redundant bits terminates.

Additionally, as described with reference to FIG. 4, by the insertion of the redundant bits, the condition on which the code word can be converted sometimes differs. For example, on the condition 4, the replacement condition differs immediately before the redundant bit. This is a processing for maintaining k=9, even when two redundant bits are 00. Moreover, similarly, immediately after the redundant bit, the code word conversion with L(k−1)=6 is not performed. The above processing enables (1, 9) RLL to be maintained even when the redundant bits are inserted.

That is, as described above, according to the present invention, a plurality of coding tables 13 are used including the output code word C(k) corresponding to the input data word D(k), and the coding table designation information S(k+1) for designating the coding table for use in encoding the next code word, and two redundant bits are inserted in each predetermined data word in the output code word outputted as a binary series, so that the DSV control can necessarily and apparently be possible while k=9 is satisfied.

A prohibition processing of the repetition of the shortest run will next be described. In FIG. 8, the repetitions of the shortest run, that is, 2T pattern includes the repetition of S(k)=0 and D(k)=8 and the repetition of S(k)=2 and D(k)=15.

First, in the former repetition, that is, when further D(k)=8 comes after S(k)=0 and D(k)=8, D(k)=8 is replaced with D(k)=12 by way of exception, and the next state, that is, the coding table S(k)=1 is selected. That is, 010101 010101 is changed to 010000 000100. This pattern is not a replaceable pattern as described with reference to FIG. 4. After 010000, the state S(k+1) is 2 or 3, and does not transfer to 1, and decoding is possible by way of exception.

Moreover, in the latter repetition, that is, when further D(k)=15 comes after S(k)=2 and D(k)=15, similarly as the code word replacement on the condition 4, 101010 101010 may be replaced with 101010 000000, and without any exception, the decoding is possible.

On the condition 4 shown in FIG. 4, the repetition of 101010 is prohibited. After all the conditions are checked, the repetitions of the 010101 and 101010 patterns are prohibited.

To detect the occurrence of the successive repetition, with 010101, the repetition of S(k)=0 and D(k)=8 may be monitored. With 101010, the repetition of S(k)=2 and D(k)=15 may be monitored. In FIG. 2, the shortest run repetition detection unit 130 checks the output code word C(k−1), state S(k), and input data word D(k) to detect the repetition of the shortest run, sends the results to the coding table address operation unit 122, and limits the repetition of the shortest run.

A demodulation method and apparatus according to the present invention will next be described. FIG. 11 shows one embodiment of the demodulation apparatus suitable for the present invention.

For the input code words other than the input code words with the redundant bits inserted therein, the bit string of the input code words is NRZI-demodulated by an NRZI demodulator 501, and a synchronization detection circuit 502 detects the synchronous word. The NRZI-demodulated signal and synchronous word are constituted in a code string C(k) each having six bit length by a serial/parallel converter 503 in accordance with a word clock as a timing signal for conversion to parallel six bits. Thereafter, the code word C(k−1) inputted into a word register 504 and delayed by one word is inputted into a detection unit 505 of judgment information of the code word, and the judgment information described later is calculated/outputted. The judgment information and input code word Ck are inputted in a state calculator 506, and the state S(k) indicating the coding table by which the encoding has been performed among four coding tables is outputted. In accordance with an address by the code word C(k−1) and state S(k) in an address generator 507, the output data word is outputted, for example, from a decoding table 508 shown in FIG. 12.

As described with reference to FIG. 5, the insertion position of the redundant bits can be known by the word clock from the synchronization detection circuit 502 in which the synchronous word is used as a reference, and a bit clock generated by PLL means (not shown), and a redundant bit extractor 509 can remove the redundant bits. The code word series from which the redundant bits are removed is decoded as described above.

As shown in FIG. 12, the judgment information is divided into four for 0, 1, 2, and 3, and indicates the coding table by which the next code word is to be encoded by the zero run length on the LSB side. That is, the coding table by which the previous code word C(k−1) and the present code word are to be encoded is known, and thereby the code word C(k−1) is demodulated into the output data word D(k−1).

(Equation 1)

```
Input the judgement information and code word.
{
    if (judgement information = = 0) {
        if (d= =1 | |d= =17| |d= =18| |d= =21| |d= =20| |d= =0| |d= =16)
            state = 0;
        else
        state = 1;
    }
    else if (judgement information = = 1) {
        if (d= =9| |d= =5| |d= =2| |d= =4| |d= =8| |d= =10)
            state = 1;
        else if (d= =33| |d= =17| |d= =18| |d= =36| |d= =40| |d= =42|
                |d= =1| |d= =0)
            state = 2;
        else
            state = 3;
    }
    else if (judgement information = = 2) {
        if (d= =33| |d= =17| |d= =18| |d= =36| |d= =40| |d= =42| |d= =4|
                |d= =8| |d= =10| |d= =1)
            state =2;
        else
            state =3;
    }
    else if (judgement information = = 3) {
        if (d= =33| |d= =17| |d= =18| |d= =36| |d= =40| |d= =42| |d= =8|
                |d= =10||d= =1)
            state = 2;
        else if (d= =4)
            state = 1;
        else
        state = 3;
}
return state
}
```

Equation 1 is a calculation for obtaining the state S(k) from the code word C(k) and judgment information, and is described in C language. According to the calculation, the state S(k) is obtained from the judgment information and code words C(k), C(k−1), and the code word C(k−1) can be demodulated in the output data word D(k−1) according to the demodulation table of FIG. 13.

For example, as shown in FIG. 14, when a code word string 010000 001001 000001 000101 010001 is inputted in the demodulation apparatus shown in FIG. 11, for the judgment information of the code word C(k−1)=010000, the zero run length on the LSB side is 4, and therefore the judgment information is 3 as shown in FIG. 2. Moreover, the next code word C(k) continues as 001001 (9 in decimal), this is applicable to a first condition judgment of Equation 1, and it is therefore seen that S(k) is 0. Therefore, with the code word C(k−1) of the demodulation table of FIG. 13, the state S(k) of row 010000 is 3, and 14 is obtained as the output data word D(k−1). That is, the output data word D(k−1) corresponding to the code word C(k−1) of a time k−1 is determined from the state information (number) S(k) of the coding table in which the code word C(k) of a time k is generated. Similarly, for 001001, the judgment information is 0, and 000001 of the subsequent code word is in the state S(k)=0 of the coding table. Therefore, the output data word D(k−1) is obtained as 0 according to the demodulation table of FIG. 13. Similarly, for 000001, D(k−1) is obtained as 1, and for 000101, D(k−1) is obtained as 1. Additionally, 001001 is a code word replaced on a first condition of the condition 1 of FIG. 4 for the DSV control. However, from the above description, it is apparent that the decoding can normally be performed.

As described above, according to the present invention, the continuous binary data series is converted to the four bit unit of the input data word. Thereafter, it is possible to insert the redundant bits such that the DSV polarity can necessarily be reversed for each predetermined data word interval. Moreover, the DSV control is possible even in the coding table, the DC components of the output code word string can effectively be suppressed, and it is possible to limit the repetition of the shortest run.

It should be understood that many modifications and adaptations of the invention will become apparent to those skilled in the art and it is intended to encompass such obvious modifications and changes in the scope of the claims appended hereto.

What is claimed is:

1. A modulation method comprising:

referring to a plurality of coding tables each including output code words corresponding to input data words, and coding table designation information in which a coding table for use in encoding a next input data word is designated, to thereby encode a four bit unit of a plurality of continuous input data words into a six bit unit of a plurality of continuous output code words, said plurality of coding tables including at least a first coding table and a second coding table, first and second signals being reverse to each other in polarity, the first and second signals being respectively obtained by subjecting a first output code word of said first coding table corresponding to a predetermined input data word and a second output code word of said second coding table corresponding to said predetermined input data word to NRZI modulation: and inserting two redundant bits into said plurality of continuous output code words for each predetermined number of corresponding data words, so that a digital sum variation (DSV) control is performed in any section irrespective of the redundant bits, k satisfies 9 in a (1, k) run length limited (RLL) rule, and a successive repetition frequency of a minimum run is limited.

2. The modulation method according to claim 1 wherein even when any one of said first output code word and said second output code word is selected after outputting a specified output code word, k satisfies 9 in the (1, k) RLL rule for the selected one.

3. The modulation method according to claim 2, further comprising:

storing said first output code word and said second output code word separately, when an output code word designated by the coding table designation information and corresponding to the input data word is detected to be any one of said first output code word and said second output code word;

calculating a codeword digital sum (CDS) for each of said stored first output code word and second output code word;

adding two CDSs corresponding to said first output code word and said second output code word to corresponding DSV values previously stored, and storing the addition results as two new DSV values;

comparing absolute values of said two DSV values with each other; and outputting an output code word corresponding to a DSV value having a smaller absolute value among said two DSV values corresponding to said first output code word and said second output code word.

4. The modulation method according to claim 3, further comprising a step of replacing an output code word corresponding to said predetermined input data word with another output code word in the designated coding table, when a successive repetition of a shortest run is detected to occur by a repetition of said predetermined input data word, to thereby limit the number of repetitions of said shortest run to a predetermined or less number, so that k satisfies 9 in the (1, k) RLL rule even with an output of said another output code word.

5. A demodulation method of demodulating said plurality of continuous output code words encoded by using the modulation method according to claim 1 and having said two redundant bits inserted for each predetermined number of data words, into a reproduction data string, said method comprising:

extracting said inserted redundant bits and restoring said plurality of continuous code words; and demodulating said plurality of continuous code words into said reproduction data string based on judgment information indicating a coding table by which a subsequent code word is encoded among said plurality of coding tables, and said subsequent code word.

6. An information recording medium in at least a part of which said plurality of continuous output code words encoded by using the modulation method according to claim 1 is recorded.

7. An information transmission method comprising a step of transmitting said plurality of continuous output code words encoded by using the modulation method according to claim 1 as transmission information.

8. A modulation apparatus comprising:

a plurality of coding tables each including output code words corresponding to input data words, and coding table designation information in which a coding table for use in encoding a next input data word is designated, said plurality of coding tables including at least a first coding table and a second coding table, first and second signals being reverse to each other in polarity, the first and second signals being respectively obtained by subjecting a first output code word of said first coding table corresponding to a predetermined input data word and a second output code word of said second coding table corresponding to said predetermined input data word to NRZI modulation;

encoding means for referring to said plurality of coding tables, and thereby encoding a four bit unit of a plurality of continuous input data words into a six bit unit of a plurality of continuous output code words; and redundant bits inserting means for inserting two redundant bits into said plurality of continuous output code words for each predetermined number of corresponding data words, so that a digital sum variation (DSV) control is performed in any section irrespective of the redundant bits, k satisfies 9 in a (1, k) run length limited (RLL) rule, and a number of successive repetitions of a minimum run is limited.

9. The modulation apparatus according to claim 8 wherein even when said encoding means selects any one of said first output code word and said second output code word after outputting a specified output code word, k satisfies 9 in the (1, k) RLL rule for the selected one.

10. The modulation apparatus according to claim 9 wherein said encoding means includes selecting means for selecting any one of said first output code word and said second output code word.

11. The modulation apparatus according to claim 9, further comprising:

a pair of first storing means for storing therein said first output code word and said second output code word respectively, when an output code word designated by the coding table designation information and corresponding to the input data word is detected to be any one of said first output code word and said second output code word;

calculating means for calculating a codeword digital sum (CDS) for each of said stored first output code word and second output code word;

a pair of second storing means for adding two CDSs corresponding to said first output code word and said second output code word to corresponding DSV values previously stored, and storing therein the addition results as two new DSV values;

absolute value comparing means for comparing absolute values of said two DSV values with each other; and output means for outputting the output code word corresponding to a DSV value having a smaller absolute value among said two DSV values corresponding to said first output code word and said second output code word based on a comparison result by said absolute value comparing means.

12. The modulation apparatus according to claim 11, wherein said encoding means includes code word replacing means for replacing an output code word corresponding to said predetermined input data word with another output code word in the designated coding table, when a successive repetition of a shortest run is detected to occur by a repetition of said predetermined input data word, to thereby limit the number of repetitions of said shortest run to a predetermined or less number, so that k satisfies 9 in the (1, k) RLL rule even with an output of said another output code word.

13. A demodulation apparatus which demodulates said plurality of continuous output code words encoded by using the modulation apparatus according to claim 8 and having two redundant bits inserted for each predetermined number of data words, into a reproduction data string, said apparatus comprising:

redundant bit extracting means for extracting said redundant bits and restoring said plurality of continuous code words; and demodulating means for demodulating said plurality of continuous code words into said reproduction data string based on judgment information indicating a coding table by which a subsequent code word is encoded among said plurality of coding tables, and said subsequent code word.

14. An information recording medium in at least a part of which said plurality of continuous output code words encoded by using the modulation apparatus according to claim 8 is recorded.

15. An information transmission apparatus which transmits said plurality of continuous output code words encoded by using the modulation apparatus according to claim 8 as transmission information.

* * * * *